(12) United States Patent
Ilkov

(10) Patent No.: US 8,306,481 B2
(45) Date of Patent: Nov. 6, 2012

(54) SINGLE POLE MULTI THROW SWITCH

(75) Inventor: Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 551 days.

(21) Appl. No.: 12/609,199

(22) Filed: Oct. 30, 2009

(65) Prior Publication Data

US 2011/0105055 A1 May 5, 2011

(51) Int. Cl.
*H04B 1/44* (2006.01)
*H04K 3/00* (2006.01)
(52) U.S. Cl. .......................................... 455/78; 343/860
(58) Field of Classification Search .................. 455/78, 455/80–83, 107, 280–281; 343/852, 860, 343/876
See application file for complete search history.

(56) References Cited

U.S. PATENT DOCUMENTS

| | | | |
|---|---|---|---|
| 6,804,502 B2 | 10/2004 | Burgener et al. | |
| 7,123,898 B2 | 10/2006 | Burgener et al. | |
| 7,391,282 B2 | 6/2008 | Nakatsuka et al. | |
| 2004/0085118 A1 | 5/2004 | Numata | |
| 2005/0110558 A1* | 5/2005 | Talwalkar et al. | 327/534 |
| 2005/0179506 A1 | 8/2005 | Takahashi et al. | |
| 2005/0281210 A1 | 12/2005 | Makino | |
| 2006/0193730 A1 | 8/2006 | Rosenstein et al. | |
| 2006/0214238 A1 | 9/2006 | Glass et al. | |
| 2006/0261912 A1 | 11/2006 | Miyagi et al. | |
| 2007/0018247 A1 | 1/2007 | Brindle et al. | |
| 2007/0096845 A1 | 5/2007 | Adachi et al. | |
| 2007/0120103 A1 | 5/2007 | Burgener et al. | |
| 2007/0290744 A1 | 12/2007 | Adachi et al. | |
| 2008/0265978 A1 | 10/2008 | Englekirk | |

FOREIGN PATENT DOCUMENTS

| | | |
|---|---|---|
| EP | 1289159 | 3/2003 |
| EP | 1291954 | 3/2003 |
| EP | 1418680 | 5/2004 |
| EP | 1505683 | 2/2005 |
| JP | 200378441 | 3/2003 |
| JP | 2004187129 | 7/2004 |
| JP | 2005191649 | 7/2005 |
| WO | 9710621 | 3/1997 |

OTHER PUBLICATIONS

European Search Report for EP 10 18 8896 dated Mar. 1, 2011.
Kelly, et al., "The State-of-the-Art of Silicon-on-Sapphire CMOS RF Switches", IEEE, CSIC Digest, 2005, pp. 200-203.
Notice of Rejection in JP2010-244873 dated Jul. 24, 2012.

* cited by examiner

*Primary Examiner* — Lee Nguyen
(74) *Attorney, Agent, or Firm* — Banner & Witcoff, Ltd.

(57) ABSTRACT

A single pole multi throw switch comprises a first switching unit, a second switching unit coupled to a common port and comprising a parasitic off state capacitance, and a matching unit. The matching unit may be coupled between the first switching unit and the common port, wherein the matching unit is configured to contribute, in conjunction with the parasitic off state capacitance of the second switching unit, to an impedance match if the first switching unit is active and the second switching unit is inactive.

18 Claims, 6 Drawing Sheets

SINGLE POLE MULTI THROW SWITCH

BACKGROUND

In single pole N-throw radio-frequency (RF) switches, the insertion loss is degraded by the on-resistance of the switching active element (e.g. CMOS transistors, complementary metal-oxide-semiconductor transistor) and (N−1) times the parasitic capacitance of the off-ports in series with 1/(N−1) the resistance of the off-ports shunts, used to improve the port to port isolation. The resistance can be reduced by increasing the size (e.g. length or width) of the shunts and the capacitance is matched by external LC matching network. For antenna switching applications, for example, a parallel inductor is added for ESD protection and compensation of the parasitic capacitance at the low side frequency band while a serial inductor-parallel capacitor network is used for high band matching.

A drawback of some of the known switches is the high insertion loss. A drawback of some other known switches is the high number of discrete elements or external components.

SUMMARY

Various aspects are disclosed herein. For example, some aspects are directed to a single pole multi throw switch. The switch may comprise a first switching unit, a second switching unit coupled to a common port and comprising a parasitic off state capacitance, and a matching unit. The matching unit may be coupled between the first switching unit and the common port, wherein the matching unit is configured to contribute, in conjunction with the parasitic off state capacitance of the second switching unit, to an impedance match if the first switching unit is active and the second switching unit is inactive.

These and other aspects of the disclosure will be apparent upon consideration of the following detailed description.

BRIEF DESCRIPTION OF THE DRAWINGS

Various illustrative embodiments will be explained in greater detail in the following with reference to the accompanying figures, in which.

Figure 1:
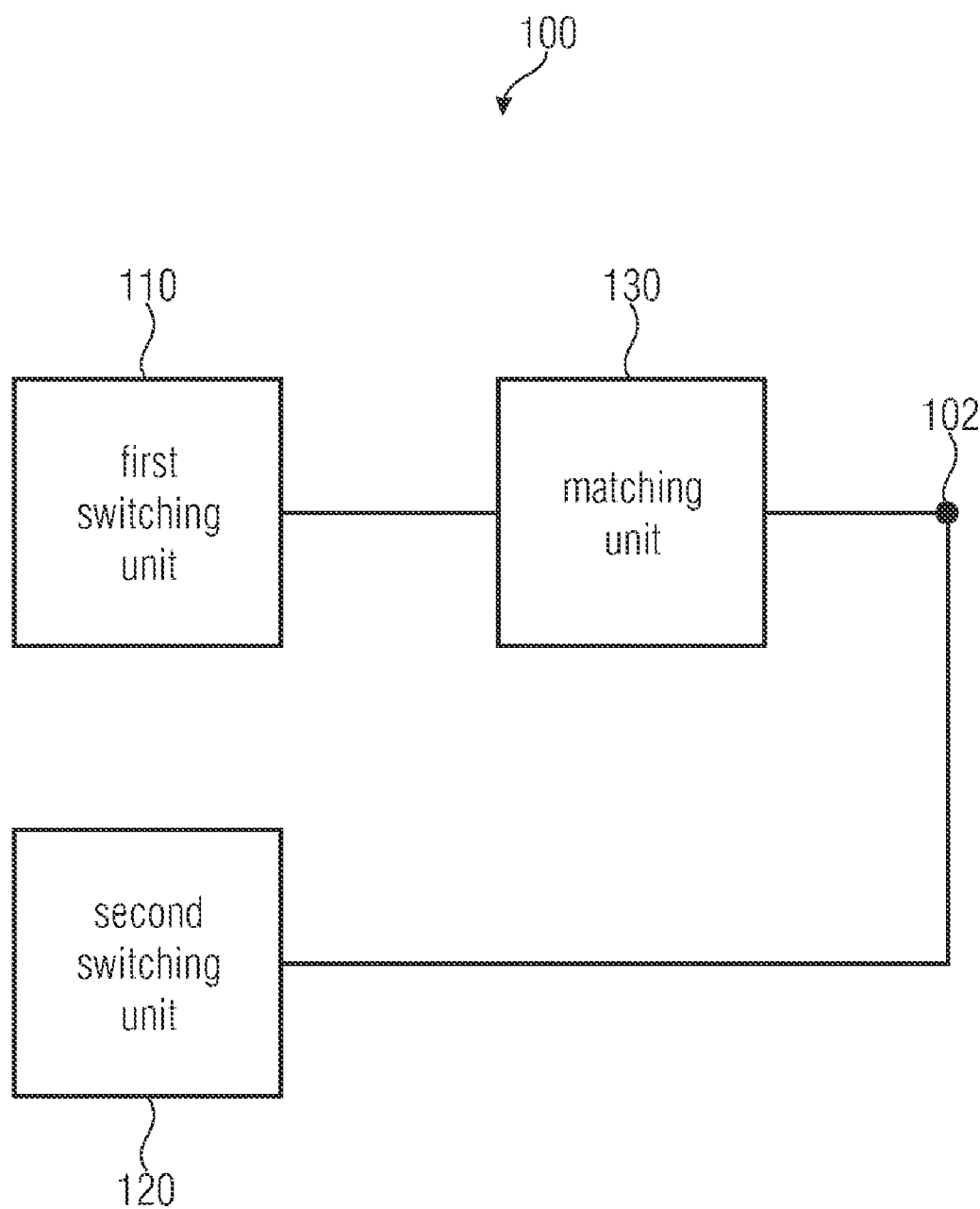
FIG. 1 is a block diagram of a single pole multi throw switch according to an illustrative embodiment.

In the following, the same reference numerals are partly used for functional units and other elements having the same or similar functional properties and the description thereof with regard to a figure shall apply also to other figures in order to reduce redundancy in the description of the embodiments.

DETAILED DESCRIPTION

FIG. 1 shows a block diagram of a single pole multi throw switch 100 according to an illustrative embodiment. The single pole multi throw switch 100 comprises a first switching unit 110, a second switching unit 120 and a matching unit 130. The second switching unit 120 is coupled to a common port 102, and comprises a parasitic off state capacitance. The matching unit 130 is electrically coupled between the first switching unit 110 and the common port 102. Further, the matching unit 130 is configured to contribute, in conjunction with the parasitic off state capacitance of the second switching unit 120, to an impedance match, if the first switching unit 110 is active and the second switching unit 120 is inactive.

By implementing the single pole multi throw switch 100 with two separate switching units and by using the parasitic off state capacitance of the second switching unit 120 for an output matching of the first switching unit 110, the insertion loss of the switch 100 may be significantly reduced. Further, by using the parasitic off state capacitance of the second switching unit 120, which is effective at a common port side of the matching unit 130 for impedance matching, a matching capacitor conventionally required for the impedance matching, for example as a part of the matching unit 130, may not be necessary anymore. In this way the number of elements or external components of the switch may be reduced. Reducing the number of elements of the switch may also reduce the costs of the switch. Additionally, the impedance matching (e.g. at the common port) for the first switching unit 110 (or for a path through the first switching unit) and/or for the second switching unit 120 (or for a path through the second switching unit) may be improved.

The single pole of the single pole multi throw switch 100 is represented by the common port 102. Further, each switching unit 110, 120 comprises at least one input and/or output terminal coupled to a "throw" port of the switch 100 for receiving signals to be provided to the common port 102 or for providing signals to be received from the common port 102.

The common port 102 may be coupled, for example, to an antenna or a transmission line for receiving or transmitting signals.

The matching unit 130 may be configured to take advantage of the parasitic off state capacitance to match the impedance for signals running from the common port 102 to the first switching unit 110 or from the first switching unit 110 to the common port 102 if the first switching unit 110 is active. In other words, the matching unit 130 may be designed as if the parasitic off state capacitance of the second switching unit 120 would be an element or a component of the matching unit 130.

The first switching unit 110 and the second switching unit 120 comprise at least one signal path each. A switching unit is active, if the signal path of the switching unit is switched on, so that a signal is able to pass the switching unit from the common port 102 to an output of the switching unit or from an input of the switching unit to the common port 102. Naturally, the switching unit may be bidirectional, such that a "throw" port of the switching unit may be an input/output port. On the other hand, a switching unit is inactive, if no signal path of the switching unit is switched, so that a signal is able to pass the switching unit.

The matching unit 130 contributes, in conjunction with the parasitic off state capacitance of the second switching unit 120, to an impedance match, if the first switching unit is active. This means, for example, that reflections of signals passing the first switching unit 110 (e.g. from a "throw" port of the first switching unit towards the common port) may be reduced in comparison to a switch without a matching unit 130.

Further, the matching unit 130 may contribute to an impedance match, if the first switching unit 110 is inactive and the second switching unit 120 is active. In other words, the matching unit 130 may also reduce reflections of signals passing the second switching unit 120 (e.g. from a "throw" port of the second switching unit towards the common port).

Although the first switching unit 110 comprises also a parasitic off state capacitance, an influence of the parasitic off state capacitance of the first switching unit 110 on the impedance match for signals passing the second switching unit 120 is lower than the influence of the parasitic off state capacitance of the second switching unit 120 on an impedance match for signals passing the first switching unit 110, since the first switching unit 110 is coupled to the common port 102 through the matching unit 130, while the second switching unit 120 is preferably coupled to the common port directly (e.g. without any lumped element between). This may reduce the influence of the parasitic off state capacitance of the first switching unit 110 for signals passing the second switching unit 120. In other words, the matching unit 130 is configured, so that a contribution of the parasitic off state capacitance of the first switching unit 110 to the impedance match, if the second switching unit is active, is lower than a contribution of the parasitic off state capacitance of the second switching unit 120 to the impedance match, if the first switching unit 110 is active.

In some embodiments, the second switching unit 120 is directly connected to the common port 102. In this case, "directly connected" means that the coupling between the common port 102 and the second switching unit 120 is realized only by a wire or other mere conductor. No discrete element, as for example an inductor or capacitance, is coupled electrically between the second switching unit 120 and the common port 102 (e.g. between a switching device of the second switching unit and the common port). In other words, considering for example the inductance of the connecting wire, the electrical connection between the second switching unit 120 and the common port 102 typically comprises an inductance lower than 10% (or lower than 0.1%, 1%, 5%, 20%, 50%) of an inductance of an electrical path from the first switching unit 110 through the matching unit 130 to the common port 102.

The single pole multi throw switch 100 may be used to switch higher frequency signals with the first switching unit 110 and lower frequency signals with the second switching unit 120. In other words, the switch 100 may (simultaneously or in sequence) receive or provide signals with different frequencies at the common port 102. Some of these signals comprise higher frequencies than others. So the signals may be divided in higher frequency signals and lower frequency signals wherein the border between lower frequency and higher frequency may be adapted to the specific application. For example, for mobile phone or cellular handset applications, signals with frequencies lower than 1 GHz may be defined as "lower frequency signals" and signals with frequencies higher than 1 GHz may be defined as "higher frequency signals". So, the impedance match of the signal path from the common port 102 through the first switching unit 110 may be improved by the matching unit 130 for signals with a higher frequency than signals to be switched by the second switching unit 120. In other words, the single pole multi throw switch 100 may be able to switch at least one lower frequency signal and at least one higher frequency signal and the matching unit 130 may be designed so that the impedance match caused by the matching unit 130 is better for the higher frequency if switched by the first switching unit 110 than an impedance match for the higher frequency signal if switched by the second switching unit 120. In even other words, the matching unit may be configured, so that a signal path through the first switching unit 110 achieves a preset impedance match for a signal with a first frequency, wherein a signal path through the second switching unit 120 do not achieve the preset impedance match even for a signal with a second frequency being 50% (or 80%, 30%, 10%, 1%) lower than the first frequency. Further, the impedance match for the signal path from the common port 102 through the second switching unit 120 may be improved by the matching unit 130 for signals with lower frequency than signals to be switched by the first switching unit 110. In other words, the matching unit 130 may in some cases be designed, so that the impedance match caused by the matching unit 130 is better for the lower frequency signal if switched by the second switching unit 120 than an impedance match for the lower frequency signal if switched by the first switching unit 110.

Figure 2:
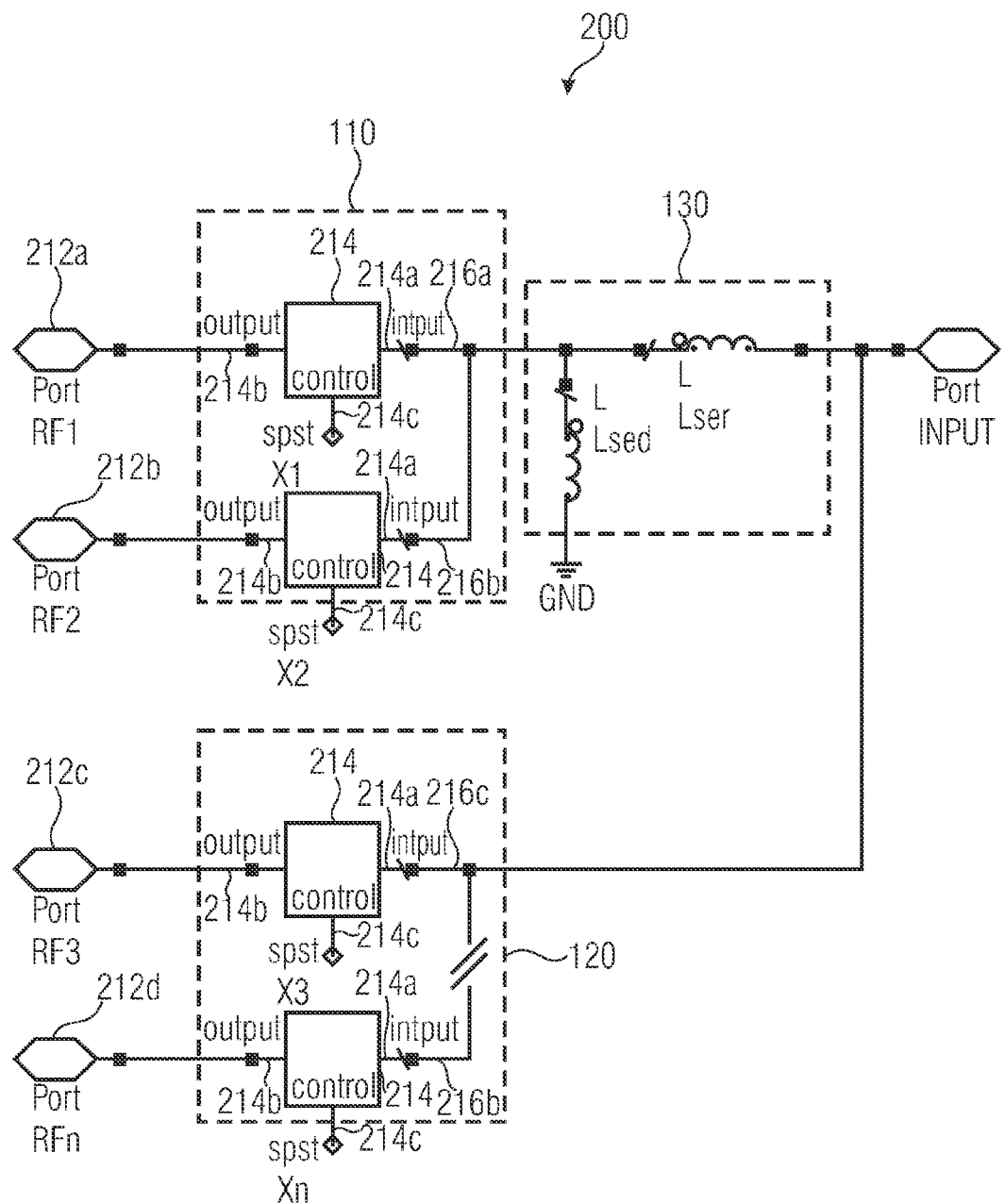
FIG. 2 is a block diagram of a single pole multi throw switch according to an illustrative embodiment.

FIG. 2 shows a block diagram of a signal pole multi throw switch 200 according to an illustrative embodiment. The single pole multi throw switch 200 illustrates a more detailed example for the concept shown in FIG. 1. In this example each switching unit 110, 120 comprises at least two signal paths 216a,b, 216c,d, each signal path 216a-216b being coupled to its own port 212a-212d (ports RF1, RF2, RF3, RFn) and comprising a switching device 214.

In FIG. 2 the common port 102 is indicated as input and the ports 212a-212d of the signal paths 216a-216d of the switching units 110, 120 are indicated as outputs for signals received at the common port 102. Alternatively, the ports 212a-212d of the signal paths 216a-216d of the switching units may be defined as inputs and the common port 102 may defined as an output for signals to be provided at the common port 102. The common port 102 and the ports 212a-212d of the signal paths 216a-216d of the switching units may also be used as input and output for receiving and providing a signal at the common port 102. So, the single pole multi throw switch 200 may be used for a receiver, a transmitter or a transceiver. In the following a terminal indicated as input may also be an output or an input-output terminal, since a switch may be used for receiving and/or providing a signal at the common port 102.

Each switching device 214 comprises a first terminal coupled to the matching unit 130 and a second terminal coupled to the port of the corresponding signal path 216 for receiving a signal to be provided to the common port 102 or for providing a signal received from the common port 102. Further, each switching device 214 comprises a control input for receiving a control signal. The control signal may control the switching device 214 in terms of activating or deactivating the switching device 214.

The switching device 214 may comprise, for example, a transistor, a relay or a micromechanical switch.

The single pole multi throw switch 200 may be used to provide (or transmit) and/or receive signals of different frequency ranges at the different ports 212a-212d of the switching units. According to the example described before, the ports 212a,b of the first switching unit 110 may receive or provide signals with frequencies higher than frequencies of signals received or provided at the ports 212c,d of the second switching unit 120. In other words, the ports 212a,b of the first switching unit 110 may be coupled with signal sources or signal drains, which are configured for providing or processing signals with comparably high frequencies, and the ports 212c,d of the second switching unit 120 may be coupled with signal sources or signal drains, which are configured for providing or processing signals with comparably low frequencies. For such an application the matching unit 130 may be designed, so that the impedance match for high frequency signals (signals to be received or provided at the ports 212a,b of the first switching unit 110) may be improved. For a switch with a common port coupled to an antenna a plurality of signals with different frequencies may be received and may be provided at a port 212a-d of a switching unit, wherein signals with comparably higher frequencies may be provided in better quality from the first switching unit 110 than from the second switching unit 120 due to the described impedance matching. Additionally, the matching unit 130 may be designed to improve also an impedance match for low frequency signals (signals to be provided to or received at the ports 212c,d of the second switching unit 120).

In the example shown in FIG. 2 the matching unit 130 comprises a series inductor Lser and a parallel inductor Lesd. The series inductor Lser comprises a first terminal coupled to the common port 102 and a second terminal (e.g., directly) coupled to each switching device of the first switching unit 110. The parallel inductor Lesd comprises a first terminal coupled to a reference potential feed (for example ground, GND, 0V) and a second terminal coupled to a node electrically between the first switching unit 110 and the series inductor Lser. In this example, the matching unit 130 represents, in combination with the parasitic off state capacitance of the second switching unit 120 an inductor-capacitance-matching network (L-C-network) for contributing to an impedance match. By using the parasitic off state capacitance of the second switching unit 120 for the impedance match, an additional capacitor for the L-C-network is not necessary. Therefore, the number of components of the switch may be reduced in comparison with known switches.

Alternatively, the second terminal of the parallel inductor Lesd may be coupled to the common port 102 rather than to the node electrically between the first switching unit 110 and the series inductor Lser.

In another example, the series inductor Lser and/or the parallel inductor Lesd may be replaced by capacitors and/or resistors, even though the inductor arrangement shown in FIG. 2 is preferred.

Additionally to the contribution to the impedance match, the parallel inductor Lesd may be used for ESD-protection (electro static discharge).

Figure 3:
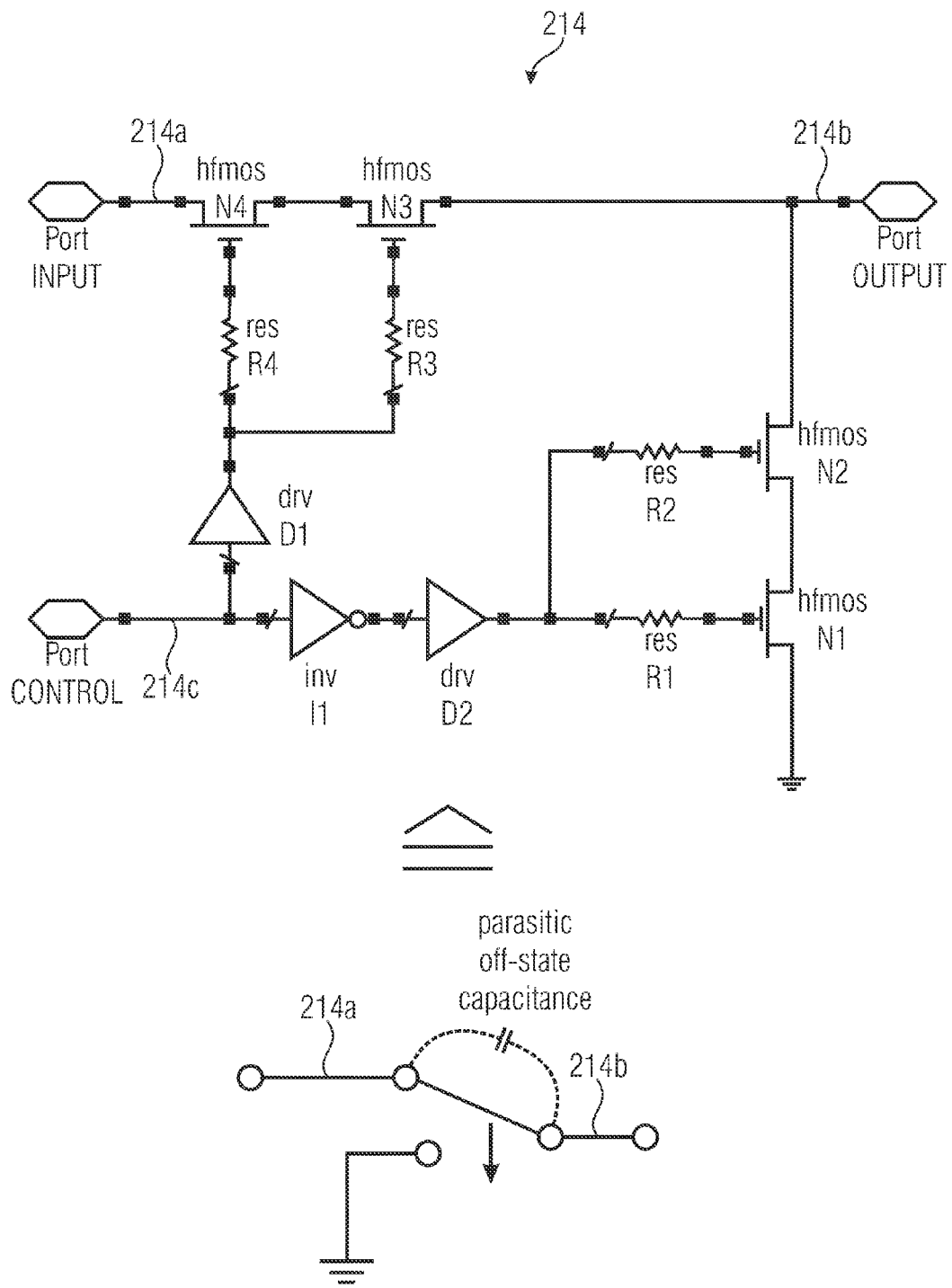
FIG. 3 is a schematic illustration of an example electrical circuit representing a switching device.

FIG. 3 shows a schematic illustration of an electrical circuit representing a switching device 214, wherein biasing circuitry, which may or may not be present for biasing the transistors N1-N4, has been omitted for simplicity. The switching device 214 shown in FIG. 3 is one example for a switching device to be implemented in the single pole multi throw switch shown in FIG. 2 and may also be called single pole single throw switch (SPST switch). The switching unit 214 comprises an input port 214a to be coupled to the matching unit (in the case of the first switching unit 110 to the side of the matching unit 130 remote from the common port 102, and in the case of the second matching unit 120 to the side of the matching unit 130 coupled to the common port 102), an output port 214b to be coupled to the port of the corresponding signal path of the switching device and a control port 214c for receiving a control signal.

As shown for example in FIG. 3 a switching device may comprise a plurality of series transistors, wherein all gates of the series transistors are coupled to the control input of the switching device. Further, a first transistor of the plurality of series transistors is coupled to the first terminal of the switching device and a last transistor of the plurality of series transistors is coupled to the second terminal of the switching device.

The example shown in FIG. 3 illustrates an SPST block with two switching (N3, N4) and shunt transistor (N1, N2) in series. The number of on- and shunt transistors (for example high frequency metal-oxide-semiconductor transistors, hfmos) in series can vary for different switched power and matching. The drivers D1 and D2 convert, for example, the logic signal (which may be inverted by the inverter I1 for the driver D2) used to control the switch to a positive voltage to switch the corresponding transistors on or to a negative voltage (or 0V) to switch the transistor off. For example, in a conductive state (on-state of the SPST block 214) N1 and N2 are off (negative voltage or 0V at the D2 output) and N3 and N4 are on (positive voltage at the D1 output). The control voltage may be chosen close to the breakdown limits in order to minimize the number of stacked transistors and thus the IC area. The gate resistors R1 to R4 may have high values to prevent additional loss and distortion due to insufficient RF isolation between the gates of the switching transistors and the low output impedance gate drivers. The power handling capability $P_{max}$ depends, for example, on the control voltage Vc, the threshold voltage Vth, the system impedance Zo and the number of stacked transistors—n:

$$P_{max} = \frac{n(Vc + Vth)^2}{Zo} \quad (2)$$

The switching device shown in FIG. 3 may be a CMOS SPST RF switch building block (complimentary-metal-oxide-semiconductor single-pole-single-throw radio-frequency switch).

In the following, a possible application of the inventive concept will be described. For example, the raising number of communication standards defined, especially in the cellular phone area, causes an increased demand for switching of 6 and more different bands. At the same time the count (or relative count) of the switches in the system bill of materials increases as single PA (power amplifier) concepts and multiple receivers are used. For example, a single pole multi throw switch may be implemented by one or more switching elements or switching devices (as example CMOS or PHEMT transistor, pseudomorphic high electron mobility transistor) between the common port (e.g. antenna port) and each switched (RF) port ("ON transistor") and a switching element between each switched port and the RF ground ("shunt transistor"). As the switching elements have considerable parasitic capacitance in OFF state and finite ohmic resistance in ON-state, for example, the value of the parasitic low-Q capacitance increases rapidly with the number of RF ports to be switched. For a high power signal more switching transistors are coupled in series so that the parasitic capacitance is reduced in times by the number of transistors in series but the increase due to the very large transistor width to reduce the insertion loss is even bigger so the performance decreases with the switch size. The technology used to build a RF switch and especially the on-resistance (Ron) and the parasitic capacitance between the nodes of the switching element (Coff) is a key to improve the performance. The product Ron*Coff may be used as a figure of merit. The insertion loss of an n-port SPnT switch (single pole multi throw switch) in a Zo impedance system is:

$$IL_{dB} = -20 \log\left(\frac{2Zo\|(n-1)Xp}{2Zo + Ron + (n-1)Xp}\right) \quad (1)$$

Figure 4:
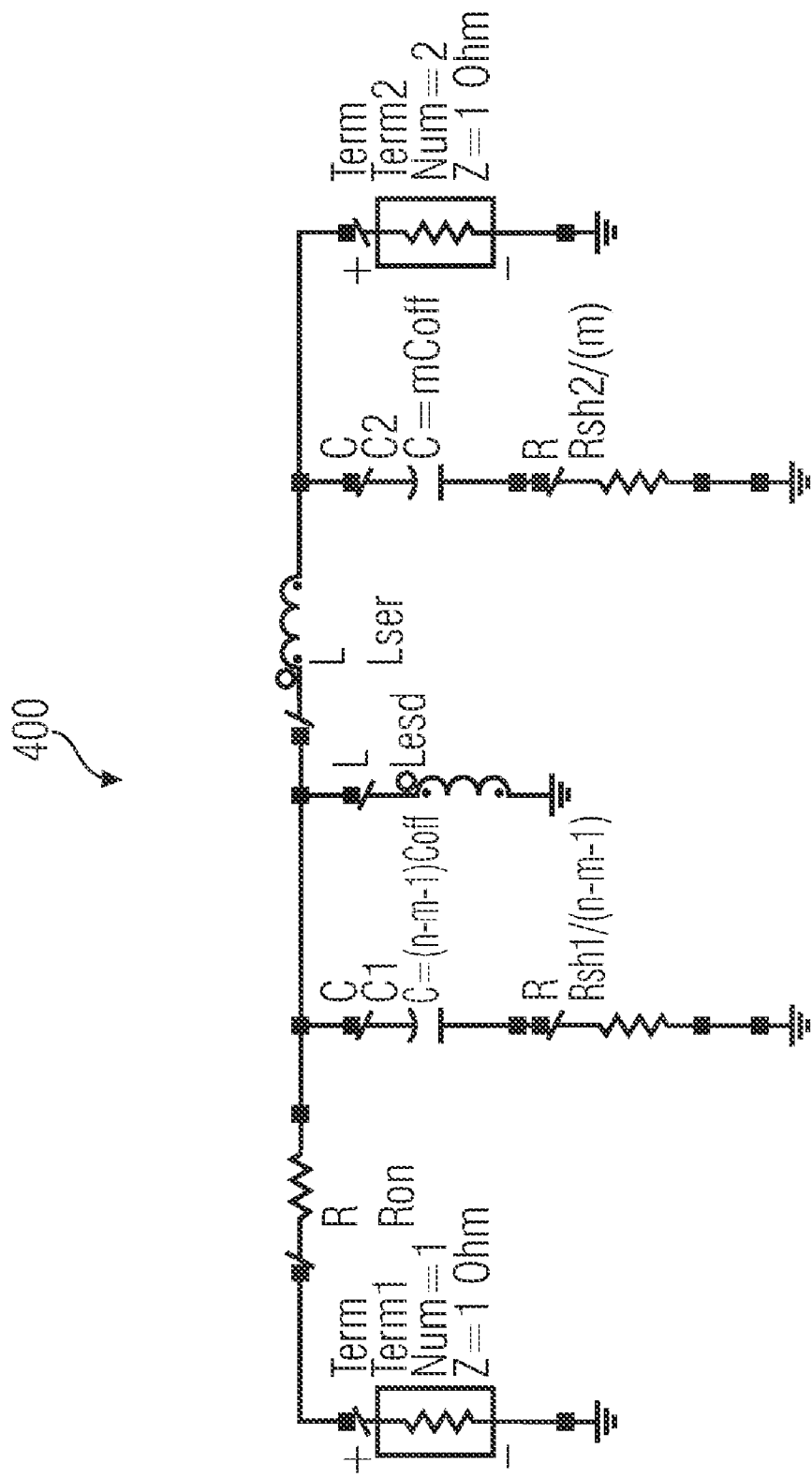
FIG. 4 is an equivalent example schematic of a single pole multi throw switch with one switching unit activated (one broadband port active)

For example, with increasing number of ports the capacitive load increases so the transformation factor of the matching network and the losses of the low-Q matching components increase as well. Since some of the switched bands, for example in the cellular handset applications, are at rather low RF frequency compared to the rest of the switched bands it is possible to split the SPnT switch into SP(n-m)T (single pole (n-m)-throw) and SPmT (single pole m-throw) where m is the number of low frequency band ports. An example for such a circuit configuration is shown in FIG. 2 and the equivalent circuit 400 is shown in FIG. 4 (one broadband port active, one port of the first switching unit 110 active). The low band ports (ports 212c,d of the second switching unit 120) are matched by the parallel inductors Lesd and Lser in series because the effect of C1 (parasitic off state capacitance of the first switching unit, FIG. 4) is small at lower frequency while the broadband nodes (ports 212a,b of the first switching unit 110) are matched by Lesd, Lser and the parasitic capacitance C2 (parasitic off state capacitance of the second switching unit) of the low band transistors. Providing direct connection of the low-band ports of the antenna (connection from the second switching unit to the common port), decreasing the number of broadband ports (e.g. when compared to conventional switches) and/or substituting the matching capacitor (e.g. a lumped capacitor conventionally arranged as a shunt capacitance at the common port) by the parasitic capacitance (parasitic off state capacitance of the second switching unit) of the low-band port switching elements may reduce the bill of materials and improve the insertion loss of the SPnT switch in the whole frequency range of operation.

In this example, the matching unit 130 or matching network may be designed, so that a π-element between the first switching unit 110 and the common port 102 is effective, which comprises a shunt inductor Lesd at the side of the π-element coupled to the first switching unit 110, a series inductor Lser between the first switching unit 110 and the common port 102 and the parasitic off state capacitance of the second switching unit 120 as shunt capacitor at the side of the π-element coupled to the common port 102, and so that a shunt impedance is effective at the common port 102 for the matching of the second switching unit 120, which is constituted by a series connection of the series inductor Lser, a parallel connection of the shunt inductor Lesd and the parasitic off state capacitance of the first switching unit 110.

Figure 5:
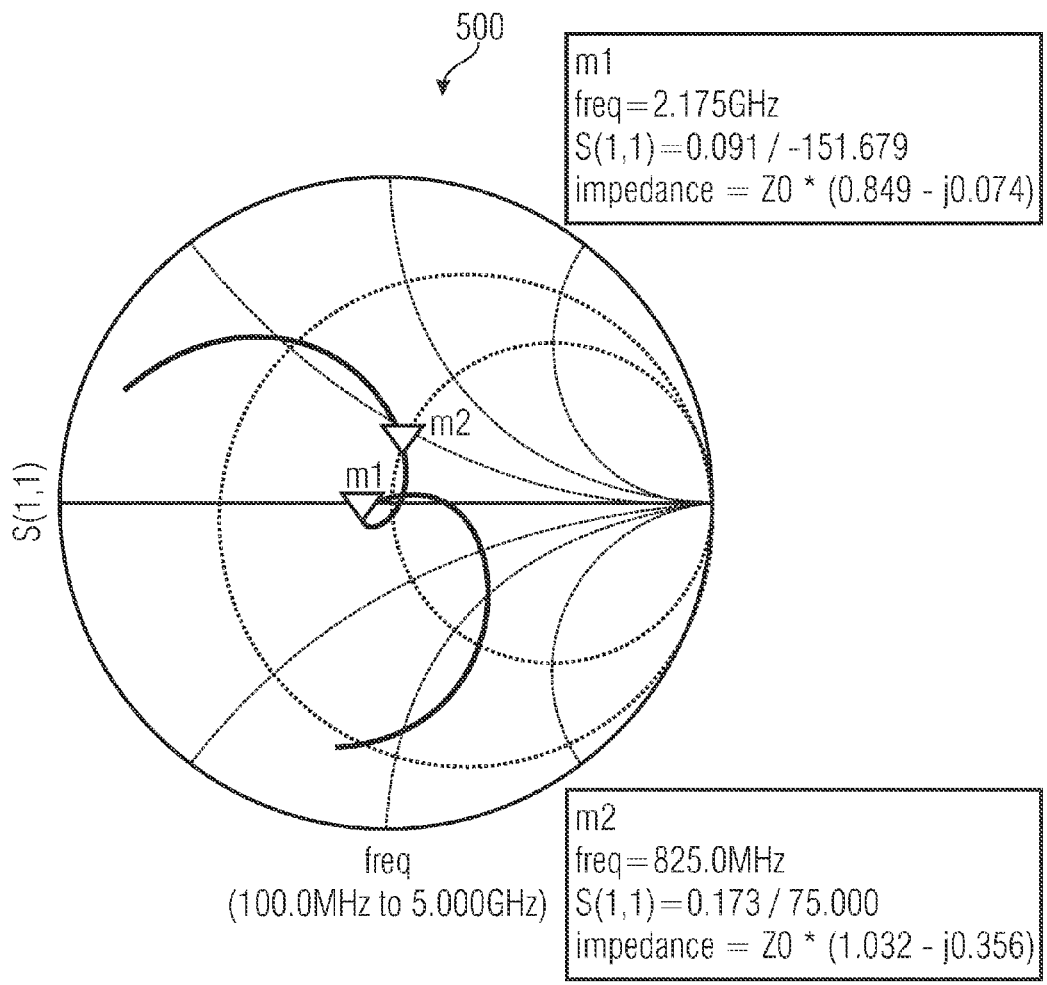
FIG. 5 is an example Smith diagram showing a matching of an inventive switch in a frequency range between 100 MHz and 5 GHz.

Additionally, FIG. 5 shows a Smith diagram 500 showing a matching of an inventive switch in a frequency range between 100 MHz and 5 GHz simulated for the schematic shown in FIG. 4. The impedance match for one of the two frequencies or for both frequencies may be improved in comparison to known switches.

In the following some variations of the embodiment shown in FIG. 2 are described.

Some embodiments relate to a single pole multi throw switch comprising a first switching unit 110, a second switching unit 120 and a matching unit 130. The second switching unit 120 is coupled to a common port 102, and comprises a parasitic off state capacitance. The matching unit 130 is electrically coupled between the first switching unit 110 and the common port 102. Further, the matching unit 130 is configured to contribute, in conjunction with the parasitic off state capacitance of the second switching unit 120, to an impedance match, if the first switching unit 110 is active and the second switching unit 120 is inactive. The first switching unit 110 comprises a first switching device and a second switching device and the second switching unit 120 comprises a first switching device and a second switching device. Further, the matching unit 130 comprises a series inductor Lser and a parallel inductor Lesd. The series inductor Lser of the matching unit is electrically coupled between the first switching unit 110 and a common port 102 and the parallel inductor Lesd is coupled to a reference potential feed with the first terminal and electrically coupled to a node between the first switching unit 110 and the series inductor Lser with the second terminal.

The first switching device of the first switching unit 110 comprises a first terminal 214a coupled to the series inductor Lser and the parallel inductor Lesd of the matching unit 130 and a second terminal 214b coupled to a first port 212a (input and/or output) of the first switching unit 110. Further, the first switching device of the first switching unit 110 comprises a control input 214c for receiving a control signal.

The second device of the first switching unit 110 comprises a first terminal 214a coupled to a node between the matching unit 130 and the first switching device of the first switching unit 110 and a second terminal 214b coupled to a second port 212b of the first switching unit 110. Further, the second switching device of the first switching unit 110 comprises a control input 214c for receiving a control signal.

The first switching device of the second switching unit 120 comprises a first terminal 214a coupled to the common port 102 and a second terminal 214b coupled to a first port 212c of the second switching unit 120. Further, the first switching device of the second switching unit 120 comprises a control input 214c for receiving a control signal.

The second switching device of the second switching unit 120 comprises a first terminal 214a coupled to the common port 102 and a second terminal 214b coupled to a second port 212d of the second switching unit 120. Further, the second switching device of the second switching unit 120 comprises a control input 214c for receiving a control signal.

Some further embodiments relate to a single pole multi throw switch comprising a first switching unit 110, a second switching unit 120 and a matching unit 130. The second switching unit 120 is coupled to a common port 102 and comprises a parasitic off state capacitance. The matching unit 130 is electrically coupled between the first switching unit 110 and the common port 102 and contributes, in conjunction with the parasitic off state capacitance of the second switching unit 120, to an impedance match, if the first switching unit 110 is active and the second switching unit 120 is inactive. Further, the matching unit 130 contributes to an impedance match, if the first switching unit 110 is inactive and the second switching unit 120 is active. The single pole multi throw switch is configured to switch at least one low frequency signal and at least one high frequency signal, wherein the matching unit 130 is configured, so that the impedance match caused by the matching unit 130 is better for the high frequency signal if switched by the first switching unit 110 than an impedance match for the high frequency signal if switched by the second switching unit 120.

Some embodiments relate to a multi band transmitter comprising a plurality of transmit units and a single pole multi throw switch according to the concept described above. Each transmit unit of the plurality of transmit units coupled to the first switching unit of the single pole multi throw switch provides a signal with a higher frequency then all frequencies of signals provided by all transmit units of the plurality of transmit units coupled to the second switching unit.

In the same way also a multi band receiver comprising a plurality of receive units and a single pole multi throw switch according to the described concept may be realized. In this case, each receive unit of the plurality of receive units coupled to the first switching unit of the single pole multi throw switch is configured to receive a signal with a higher frequency than all frequencies of signals received by all receive units of the plurality of receive units coupled to the second switching unit.

Furthermore, also a multi band transceiver may be realized by combining the concepts of the multi band transmitter and the multi band receiver described above.

In this way according to the concept described above, the signal path through the first switching unit 110 is used for signals with higher frequencies than frequencies of signals switched by the second switching unit.

Some embodiments relate to a single pole multi throw RF switch.

The term RF (radio frequency) in connection with the described concept includes frequencies from, for example, 100 MHz to 100 GHz. For example, the whole frequency range of mobile communication applications are contained. However, lower frequencies (e.g. starting from 1 MHz or even lower) may also be considered as radio frequencies.

The proposed circuit can improve the insertion loss of single multi throw RF switches and at the same time reduce the number of external components in the antenna port matching network (used to compensate the switch parasitic capacitance of known switches).

The proposed RF switch has two separated switching blocks (switching units), for example, one dedicated for the channels operating at lower frequencies and connected directly to the switch common port thus substituting the matching capacitor for the second, broadband part of the switch. An advantage may be a lower transformation factor required from the matching network (matching unit) comprising of one parallel and one serial inductor a less port count is required for the broadband switch, for example, resulting in lower overall insertion loss and the parallel capacitor used by known switches may be eliminated.

A method may be provided for splitting a single pole multi-throw switch in two or more smaller switches and combining them together by low part count diplexer, where the low part count may be achieved by using the parasitic capacitance of the RF switch itself. The described single pole multi throw switch may represent a diplexer, since high frequency signals may be switched by a first part of the switch (first switching unit) and low frequency signals may be switched by a second part of the switch (second switching unit).

Figure 6:
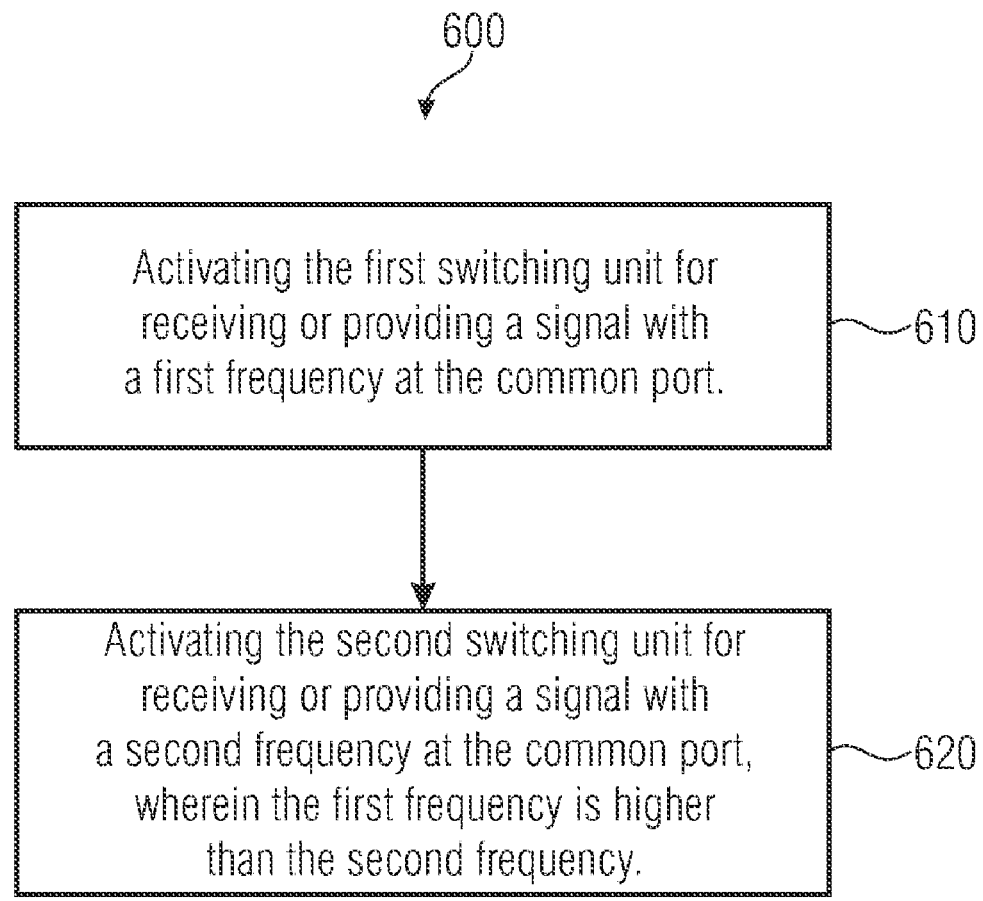
FIG. 6 is a flow chart of an illustrative method for using a single pole multi throw switch.

FIG. 6 shows a flow chart of a method 600 for using a single pole multi throw switch according to an illustrative embodiment. The single pole multi throw switch comprises a first switching unit, a second switching unit and a matching unit. The second switching unit is coupled to a common port and comprises a parasitic off state capacitance. The matching unit is electrically coupled between the first switching unit and the common port and contributes, in conjunction with the parasitic off state capacitance of the second switching unit, to an impedance match, if the first switching unit is active and the second switching unit is inactive. The method 600 comprises activating 610 the first switching unit for receiving or providing a signal with a first frequency at the common port and activating 620 the second switching unit for receiving or providing a signal with a second frequency at the common port. The first frequency is higher than the second frequency.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Although some claims only relate to one other claim, also a combination with further claims may be possible.

The invention claimed is:

1. A single pole multi throw switch, comprising:
a first switching unit;
a second switching unit coupled to a common port and comprising a parasitic off state capacitance; and
a matching unit coupled between the first switching unit and the common port, wherein the matching unit is configured to contribute, in conjunction with the parasitic off state capacitance of the second switching unit, to an impedance match if the first switching unit is active and the second switching unit is inactive.

2. The single pole multi throw switch according to claim 1, wherein the matching unit is configured to contribute to an impedance match if the first switching unit is inactive and the second switching unit is active.

3. The single pole multi throw switch according to claim 1, wherein the first switching unit comprises a parasitic off state capacitance, wherein the matching unit is configured, so that a contribution of the parasitic off state capacitance of the first switching unit to the impedance match, if the second switching unit is active, is lower than a contribution of the parasitic off state capacitance of the second switching unit to the impedance match, if the first switching unit is active.

4. The single pole multi throw switch according to claim 1, wherein the matching unit comprises a series inductor coupled between the first switching unit and the common port or comprises a parallel inductor comprising a first terminal coupled to a node between the first switching unit and the common port and comprising a second terminal coupled to a reference potential feed.

5. The single pole multi throw switch according to claim 1, wherein the matching unit comprises a series inductor coupled between the first switching unit and the common port and comprises a parallel inductor comprising a first terminal coupled to a node between the first switching unit and the series inductor and comprising a second terminal coupled to a reference potential feed.

6. The single pole multi throw switch according to claim 1, wherein the second switching unit is coupled to the common port through a direct connection.

7. The single pole multi throw switch according to claim 1, wherein an electrical connection between the second switching unit and the common port comprises an inductance lower than 10% of an inductance of an electrical path from the first switching unit through the matching unit to the common port.

8. The single pole multi throw switch according to claim 1, wherein the single pole multi throw switch is configured to switch at least one lower frequency signal and at least one higher frequency signal, wherein the matching unit is configured such that the impedance match caused by the matching unit is better for the higher frequency signal if switched by the first switching unit than an impedance match caused by the matching unit for the higher frequency signal if switched by the second switching unit.

9. The single pole multi throw switch according to claim 8, wherein the matching unit is configured such that the impedance match caused by the matching unit is better for the lower frequency signal if switched by the second switching unit than an impedance match caused by the matching unit for the lower frequency signal if switched by the first switching unit.

10. The single pole multi throw switch according to claim 1, wherein the first switching unit and the second switching unit comprise a switching device each, wherein each of the switching devices comprises a first terminal coupled to the matching unit, a second terminal configured to perform at least one of the following: receive a signal to be provided to the common port, or provide a signal received from the common port and a control input, wherein each of the switching devices is configured to be activated by a control signal received at the control input.

11. The single pole multi throw switch according to claim 10, wherein each of the switching devices comprises a plurality of series transistors, wherein the gates of the series transistors are coupled to the control input of the respective switching device, wherein a first transistor of the plurality of series transistors is coupled to the first terminal of the switching device, and wherein a last transistor of the plurality of series transistors is coupled to the second terminal of the respective switching device.

12. The single pole multi throw switch according to claim 10, wherein each of the switching device comprises a relay, a micromechanical switch, or a transistor.

13. A single pole multi throw switch, comprising:
a first switching unit;
a second switching unit coupled to a common port and comprising a parasitic off state capacitance; and
a matching unit coupled between the first switching unit and the common port, wherein the matching unit is configured to contribute, in conjunction with the parasitic off state capacitance of the second switching unit, to an impedance match if the first switching unit is active and the second switching unit is inactive,
wherein the first switching unit comprises a first switching device and a second switching device, wherein the second switching unit comprises a first switching device and a second switching device,
wherein the matching unit comprises a series inductor and a parallel inductor, wherein the series inductor of the matching unit is coupled between the first switching unit and a common port and the parallel inductor comprises a first terminal coupled to a reference potential feed and a second terminal coupled to a node between the first switching unit and the series inductor,
wherein the first switching device of the first switching unit comprises a first terminal coupled to the series inductor and the parallel inductor of the matching unit and a second terminal coupled to a first port of the first switching unit, wherein the first switching device of the first switching unit comprises a control input configured to receive a control signal,
wherein the second device of the first switching unit comprises a first terminal coupled to a node between the matching unit and the first switching device of the first switching unit and a second terminal coupled to a second port of the first switching unit, wherein the second switching device of the first switching unit comprises a control input configured to receive a control signal,
wherein the first switching device of the second switching unit comprises a first terminal directly coupled to the common port and a second terminal coupled to a first port of the second switching unit, wherein the first switching device of the second switching unit comprises a control input configured to receive a control signal, and
wherein the second switching device of the second switching unit comprises a first terminal directly coupled to the common port and a second terminal coupled to a second port of the second switching unit, wherein the second switching device of the second switching unit comprises a control input configured to receive a control signal.

14. A single pole multi throw switch, comprising:
a first switching unit;
a second switching unit coupled to a common port and comprising a parasitic off state capacitance; and
a matching unit coupled between the first switching unit and the common port, wherein the matching unit is configured to contribute, in conjunction with the parasitic off state capacitance of the second switching unit, to an impedance match as a pi-matching network between the first switching unit and the common port if the first switching unit is active and the second switching unit is inactive,
wherein the matching unit is configured to contribute to an impedance match as a shunt matching network between the common port and a reference potential feed if the first switching unit is inactive and the second switching unit is active, and
wherein the single pole multi throw switch is configured to switch at least one low frequency signal and at least one high frequency signal, wherein the matching unit is configured such that the impedance match caused by the matching unit is better for the high frequency signal if switched by the first switching unit than an impedance match caused by the matching unit for the high frequency signal if switched by the second switching unit.

15. A multi band transmitter, comprising:
a plurality of transmit units; and
a single pole multi throw switch, comprising:
  a first switching unit,
  a second switching unit coupled to a common port and comprising a parasitic off state capacitance, and
  a matching unit coupled between the first switching unit and the common port, wherein the matching unit is configured to contribute, in conjunction with the parasitic off state capacitance of the second switching unit, to an impedance match if the first switching unit is active and the second switching unit is inactive,
wherein each transmit unit of the plurality of transmit units that is coupled to the first switching unit is configured to provide a signal with a higher frequency than all frequencies of signals provided by all transmit units of the plurality of transmit units coupled to the second switching unit.

16. A multi band receiver, comprising:
a plurality of receive units; and
a single pole multi throw switch, comprising:
  a first switching unit,
  a second switching unit coupled to a common port and comprising a parasitic off state capacitance, and
  a matching unit coupled between the first switching unit and the common port, wherein the matching unit is configured to contribute, in conjunction with the parasitic off state capacitance of the second switching unit, to an impedance match if the first switching unit is active and the second switching unit is inactive,
wherein each receive unit of the plurality of receive units that is coupled to the first switching unit is configured to receive a signal with a higher frequency than all frequencies of signals received by all receive units of the plurality of receive units coupled to the second switching unit.

17. A method for using a single pole multi throw switch, wherein the single pole multi throw switch comprises a first switching unit, a second switching unit and a matching unit, wherein the second switching unit is coupled to a common port and comprises a parasitic off state capacitance, and wherein the matching unit is coupled between the first switching unit and the common port, wherein the matching unit is configured to contribute, in conjunction with the parasitic off state capacitance of the second switching unit, to an impedance match if the first switching unit is active and the second switching unit is inactive, the method comprising:
- activating the first switching unit to receive or provide a signal with a first frequency at the common port; and
- activating the second switching unit to receive or provide a signal with a second frequency at the common port, wherein the first frequency is higher than the second frequency.

18. A single pole multi throw switch, comprising:
- first switching means;
- second switching means coupled to a common port and comprising a parasitic off state capacitance; and
- matching means coupled between the first switching unit and the common port, for contributing, in conjunction with the parasitic off state capacitance of the second switching unit, to an impedance match if the first switching unit is active and the second switching unit is inactive.

* * * * *